United States Patent
Swanson

(10) Patent No.: US 6,197,654 B1
(45) Date of Patent: *Mar. 6, 2001

(54) LIGHTLY POSITIVELY DOPED SILICON WAFER ANODIZATION PROCESS

(75) Inventor: Leland S. Swanson, McKinney, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,477

(22) Filed: Aug. 21, 1998

(51) Int. Cl.$^7$ .......................... H01L 21/76; H01L 21/26; H01L 21/324; H01L 21/445; H01L 21/288

(52) U.S. Cl. .......................... 438/409; 438/408; 438/960; 438/795; 205/124; 205/106

(58) Field of Search .................................. 438/795, 409, 438/408, 960; 205/124, 106

(56) References Cited

U.S. PATENT DOCUMENTS

| | | | |
|---|---|---|---|
| 3,798,135 | * 3/1974 | Bracken et al. | 204/15 |
| 4,180,416 | * 12/1979 | Brock | 148/1.5 |
| 4,293,587 | * 10/1981 | Trueblood | 427/90 |
| 4,891,103 | * 1/1990 | Zorinsky et al. | 204/1 |
| 5,110,755 | * 5/1992 | Chen et al. | 437/62 |
| 5,217,920 | * 6/1993 | Mattox et al. | 437/67 |
| 5,358,600 | * 10/1994 | Canham et al. | 156/644 |
| 5,387,541 | * 2/1995 | Hodge et al. | 437/71 |
| 5,458,755 | * 10/1995 | Fujiyama et al. | 204/224 |
| 5,705,027 | * 1/1998 | Katayama et al. | 156/628.1 |
| 5,736,454 | * 4/1998 | Hwu et al. | 438/585 |
| 5,970,361 | * 10/1999 | Kumomi et al. | 438/409 |

OTHER PUBLICATIONS

Murate, M.; Iwate, H.; Itoigawa, K.; Micromechatronics and Human Science, 1998. MHS '98. Proceedings of the 1998 International Symposium on , 1998; pp. 57–63.*

* cited by examiner

Primary Examiner—Richard Elms
Assistant Examiner—Adam Pyonin
(74) Attorney, Agent, or Firm—Ronald O. Neerings; Wade James Brady, III; Frederick J. Telecky, Jr.

(57) ABSTRACT

A method of anodizing a lightly doped wafer wherein there is provided a lightly p-typed doped silicon wafer having a frontside and a backside. A p-type region is formed on the backside doped sufficiently to avoid inversion to n-type when a later applied current density of predetermined maximum value is applied to the backside. The wafer is placed in the electrolyte of a chamber having an electrolyte and having a pair of electrodes, preferably platinum, on opposite sides of the wafer and in the electrolyte. The current of predetermined value is passed between the electrodes and through the wafer, the current being sufficient to cause pores to form on the frontside of the wafer. The chamber preferably has first and second regions, one of the electrodes being disposed in one of the regions and the other electrode being disposed in the other regions with the wafer hermetically sealing the first region from the second region. The predetermined value of current is from about 1 to about 100 milliamperes per square centimeter. The number of chamber regions can exceed two with each adjacent pair of regions hermetically separated by a wafer.

12 Claims, 1 Drawing Sheet

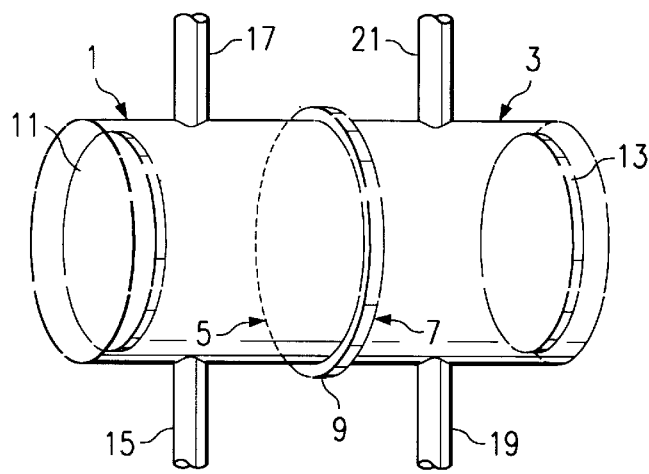
FIG. 1
(PRIOR ART)
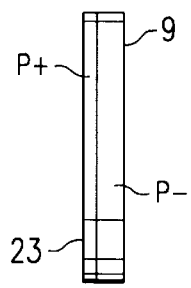
FIG. 2
FIG. 3
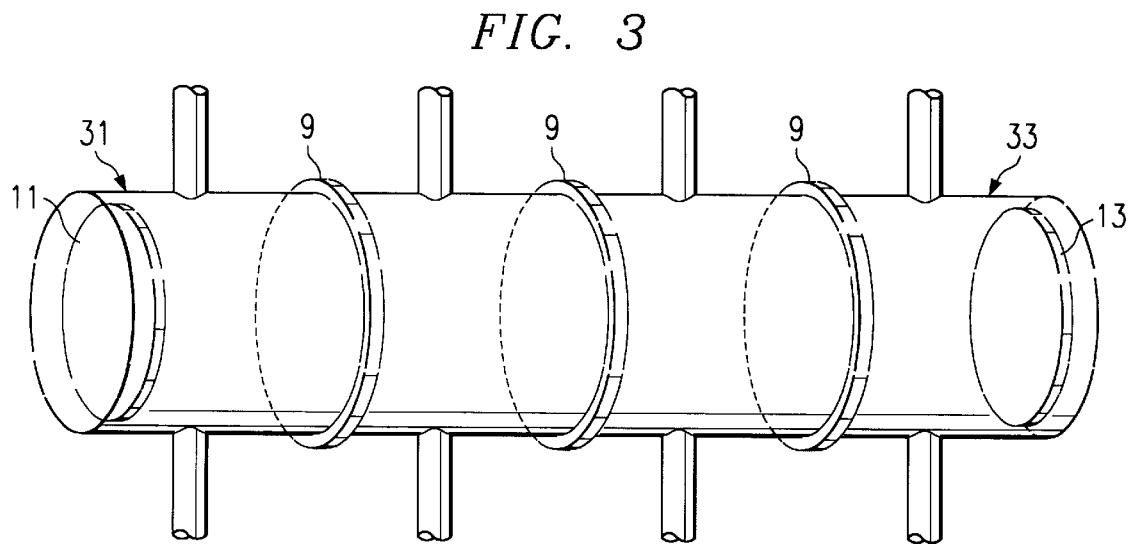

LIGHTLY POSITIVELY DOPED SILICON WAFER ANODIZATION PROCESS

FIELD OF THE INVENTION

This invention relates to a method of anodizing lightly doped silicon semiconductor wafers to provide porosity therein as applied to fabrication of such wafers one at a time and in batches of plural such wafers.

BRIEF DESCRIPTION OF THE PRIOR ART

Anodization of semiconductor wafers involves the application of a current through an electrolyte disposed over both major surfaces of the wafer via a pair of platinum electrodes disposed within the electrolyte, on opposite sides of the major surfaces of the wafer and spaced from the wafer. The electrolyte is generally a mixture of 30 to 50 percent by volume of HF (49%), an alcohol and optionally water. The preferred alcohols are methanol, ethanol, propanol and isopropanol. The result of application of this current is a porous formation on the surface of the wafer more closely adjacent the negative electrode. The amount of porosity is a function of the current density, the electrolyte used and the time length of current application through the wafer and within the electrolyte. The electrolyte is preferably constantly being recycled to maintain electrolyte component ratios.

Anodizing heavily doped wafers to produce porous silicon in the above described manner generally does not present any substantial problems with the electrochemical process itself. However, lightly doped wafers present the added difficulty of not forming a good ohmic contact to the electrolyte. A lightly doped wafer is defined within the context of this disclosure as having from about $1 \times 10^{14}$ to about $5 \times 10^{17}$ atoms of dopant/cc, this being non-degeneratively doped. This problem is most acute at the backside of the wafer, which faces the positive electrode. Negative charges accumulate on the backside of the wafer to the level such that the surface is inverted, forming a p-n junction. This p-n junction is reverse biased and restricts current flow through the wafer from the positive electrode of the current source, through the electrolyte on both sides of the wafer and the wafer to the other negative electrode. Anodization cannot proceed until this junction is broken down, however, when such breakdown occurs, the anodization process is uncontrolled.

An attempt to overcome the above described problem has been to deposit aluminum or some other metal on the backside of the wafer with subsequent sintering of the wafer to form an ohmic contact. This approach presents a problem in the semiconductor fabrication process due to metal contamination caused by the addition of the metal to the wafer backside. Furthermore, this approach is not amenable to immersion of both sides of the wafer into the electrolyte since the side of the wafer containing the metal and the metal must be kept out of the electrolyte to avoid metal contamination of the wafer and electrolyte by the metal, making it very difficult to perform the anodization as a batch process on many wafers concurrently. Making good, uniform metal contact to the coated backside also presents a problem.

SUMMARY OF THE INVENTION

In accordance with the present invention, the above described problem of the prior art is overcome and there is provided a process whereby porous silicon can be provided in lightly doped semiconductor wafers. This is accomplished by heavily doping the backside or side of the wafer which will not be rendered porous with a heavy p-type dopant, preferably boron in the case of a p-type substrate. The amount of dopant is in sufficient quantity such that the backside surface will not be inverted to n-type when the voltage from the current source is applied across the wafer through the electrolyte. The depth of the dopant is about equal to or greater than 100 nanometers. This step can be accomplished either through ion implantation or by spin coating with a boron containing slurry and diffusing the boron into the wafer. The high doping level prevents inversion of the backside of the wafer and an ohmic contact is present to allow anodization. In this way, a lightly doped silicon wafer can be provided with a porous surface either along the entire frontside surface (surface facing the negative electrode of the current source) or selectively along the frontside surface by first masking the frontside surface and then placing the wafer in the electrolyte and applying the current through the wafer and the electrolyte. The depth of the pores is generally from about 1 to about 100 microns, depending upon process requirements. The mask, when used, is preferably a silicon carbide or nitride, though other masking materials which are well known can be used.

A frontside surface of a plurality of wafers can be made porous concurrently by placing the wafers within the electrolyte spaced apart from each other and with their major surfaces in parallel. The current source electrodes are placed in the electrolyte spaced from the extreme wafers such that the current passes through all of the wafers in passing from the positive electrode to the negative electrode.

It is preferred that the wafers provide a liquid seal between the major surfaces thereof, thereby causing the totality or as much of the totality of the current flow as possible to pass through the wafers rather then around the wafers.

The current density of the current passing through the wafers is from about 1 to about 100 milliamperes per square centimeter with a preferred value depending upon process requirements.

BRIEF DESCRIPTION OF THE DRAWINGS

FIG. 1 is a schematic diagram of an arrangement for anodization of silicon wafers in accordance with the prior art and which can be used in accordance with the present invention;

FIG. 2 is a diagram of a lightly doped silicon wafer prepared for anodization in accordance with the present invention; and FIG. 3 is a schematic diagram of an arrangement for anodization in accordance with a further embodiment in accordance with the present invention.

DESCRIPTION OF THE PREFERRED EMBODIMENT

Referring first to FIG. 1, there is shown a prior art arrangement for anodizing a semiconductor wafer which is also used in accordance with the present invention. The arrangement includes a pair of chambers 1, 3, each having an open end region 5, 7. A silicon semiconductor wafer 9 is placed between the open end regions 5, 7 and the open end regions are brought together with the semiconductor wafer forming a liquid seal between the chambers 1,3. An positive platinum electrode 11 is disposed in the chamber 1 spaced from the wafer 9 and a negative platinum electrode 13 is placed in the chamber 3 spaced from the wafer 9. An electrolyte composed by volume of either 30 percent HF, 40 percent water and 30 percent isopropanol or 50 percent HF and 50 percent ethanol is recirculated through the chamber 1 via inlet 15 and outlet 17 and through chamber 3 via inlet 19 and outlet 21. As stated above, if the wafer 9 is heavily doped and the current density 50 milliamperes per square centimeter is passed through the wafer, porosity is provided on the side of the wafer facing the negative electrode 13. The thickness of the porous film is dependent upon the time of application of the current through the wafer 13.

In accordance with one embodiment of the present invention, the wafer 9 is lightly positively doped and the surface of the wafer facing the positive electrode 11 is heavily positively doped as shown by the region 23 in FIG. 2. The amount of dopant is designed to be sufficiently high to avoid inversion of the backside region when negative charges are attracted to the backside region of the wafer by the positive electrode 11. In this way, the current is able to pass through the electrolyte in the chambers 1,3, the wafer 9 and between the electrodes 11 and 13 to allow porosity to be provided at the frontside of the lightly doped wafer.

As an option, the surface of the wafer facing the negative electrode can be masked with exposed regions being heavily positively doped the same as the reversed surface as discussed with reference to FIG. 2 with anodizing then taking place. In this case, the porous region will exist only at the exposed regions of the surface facing the negative electrode. This procedure is also available without the heavy doping of the exposed regions as an option.

Referring to FIG. 3, there is shown a system as in FIG. 1 but with plural chambers of the type described above as 1 and 3 with a wafer 9 of the type described in FIG. 2 disposed between each pair of chambers to provide a liquid-tight seal at the open end of each chamber as in the embodiment of FIG. 1. A positive electrode 11 is disposed in the first chamber 31 and a negative electrode 13 is placed in the last chamber 33 with all wafers 9 disposed between the electrodes. Electrolyte is recirculated through each of the chambers in the manner above described. Like reference numbers in FIG. 3 refer to the same or similar structure as set forth in FIG. 1.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of anodizing a lightly doped wafer which comprises the steps of:
   (a) providing a lightly p-type doped silicon wafer of from about $1 \times 10^{14}$ to about $5 \times 10^{17}$ atoms of dopant/cc having a frontside which is the side facing a positive electrode during anodization and a backside which is the side facing a negative electrode during anodization;
   (b) forming a p-type region on said backside which is heavily doped relative to said wafer and sufficient to prevent inversion of the backside region when negative charges are attracted to the backside region of the wafer by a positive electrode;
   (c) placing said wafer of step (b) in an electrolyte disposed in a chamber having said electrolyte;
   (d) placing a pair of oppositely poled electrodes on opposite sides of said wafer and in said electrolyte; and
   (e) anodizing said wafer by passing said current of predetermined value between said electrodes and through said wafer, said predetermined value being sufficient to causes pores to form on said frontside of said wafer and sufficiently low to avoid inversion of said p-type region to an n-type region.

2. The method of claim 1 wherein said chamber has first and second regions, one of said electrodes being disposed in one of said regions and the other of said electrodes disposed in the other of said regions, said wafer hermetically sealing said first region from said second region.

3. The method of claim 2 wherein said electrodes are platinum.

4. The method of claim 3 wherein the predetermined value of current is from about 1 to about 100 milliamperes per square centimeter.

5. The method of claim 2 wherein the predetermined value of current is from about 1 to about 100 milliamperes per square centimeter.

6. The method of claim 1 wherein said electrodes are platinum.

7. The method of claim 6 wherein the predetermined value of current is from about 1 to about 100 milliamnperes per square centimeter.

8. The method of claim 1 wherein the predetermined value of current is from about 1 to about 100 milliamperes per square centimeter.

9. A method of anodizing a lightly doped wafer which comprises the steps of:
   (a) providing a plurality of lightly p-type doped silicon wafers of from about $1 \times 10^{14}$ to about $5 \times 10^{17}$ atoms of dopant/cc, each wafer having a frontside which is the side facing a positive electrode during anodization and a backside which is the side facing a negative electrode during anodization;
   (b) forming a p-type region on the backside of each wafer which is heavily doped relative to said wafer and sufficient to prevent inversion of the backside region when negative charges are attracted to the backside region of the wafer by a positive electrode;
   (c) placing said wafers of step (b) in a stack in an electrolyte disposed in a chamber having said electrolyte in spaced relation and parallel to each other;
   (d) placing a pair of oppositely poled electrodes on opposite sides of said stack of wafers and in said electrolyte; and
   (e) anodizing said wafer by passing said current of predetermined value between said electrodes and through said wafers, said predetermined value being sufficient to cause pores to form on said frontsides of said wafers and sufficiently low to avoid inversion of said p-type regions to n-type regions.

10. The method of claim 9 wherein said chamber has plural serially connected regions, one of said electrodes being disposed in the first of said regions and the other of said electrodes disposed in the last of said regions, said wafers hermetically sealing each of said regions from adjacent regions.

11. The method of claim 10 wherein the predetermined value of current is from about 1 to about 100 milliamperes per square centimeter.

12. The method of claim 9 wherein the predetermined value of current is from about 1 to about 100 milliamperes per square centimeter.

* * * * *